(12) United States Patent
Lee et al.

(10) Patent No.: US 9,824,988 B1
(45) Date of Patent: Nov. 21, 2017

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Yun Tae Lee, Suwon-si (KR); Sung Han Kim, Suwon-si (KR); Han Kim, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/432,152

(22) Filed: Feb. 14, 2017

(30) Foreign Application Priority Data

Aug. 11, 2016 (KR) .......................... 10-2016-0102326
Aug. 31, 2016 (KR) .......................... 10-2016-0111922

(51) Int. Cl.
*H01L 23/00* (2006.01)
*H01L 23/31* (2006.01)
*H01L 23/498* (2006.01)

(52) U.S. Cl.
CPC .......... *H01L 24/02* (2013.01); *H01L 23/3107* (2013.01); *H01L 23/49827* (2013.01); *H01L 24/09* (2013.01); *H01L 2224/02331* (2013.01); *H01L 2224/02371* (2013.01); *H01L 2224/02373* (2013.01); *H01L 2224/02379* (2013.01); *H01L 2224/97* (2013.01); *H01L 2225/06513* (2013.01); *H01L 2225/06541* (2013.01); *H01L 2924/01029* (2013.01); *H01L 2924/181* (2013.01)

(58) Field of Classification Search
CPC .......... H01L 2924/181; H01L 2224/97; H01L 2225/06541; H01L 2225/06513; H01L 23/49827
See application file for complete search history.

(56) References Cited

U.S. PATENT DOCUMENTS

| | | | |
|---|---|---|---|
| 8,263,439 B2 * | 9/2012 | Marimuthu | ........... H01L 21/565 |
| | | | 257/724 |
| 8,779,599 B2 | 7/2014 | Lin et al. | |
| 9,355,966 B2 | 5/2016 | Gallegos et al. | |
| 9,613,931 B2 * | 4/2017 | Lin | ..................... H01L 25/0652 |

(Continued)

FOREIGN PATENT DOCUMENTS

| KR | 10-2004-0008080 A | 1/2004 |
|---|---|---|
| KR | 10-2015-0015617 A | 2/2015 |
| KR | 10-2015-0046797 A | 5/2015 |

*Primary Examiner* — Ngan Ngo
(74) *Attorney, Agent, or Firm* — McDermott Will & Emery LLP

(57) ABSTRACT

A fan-out semiconductor package includes: a first connection member having a through-hole; a semiconductor chip disposed in the through-hole and having an active surface having connection pads disposed thereon and an inactive surface disposed to oppose the active surface; a dummy chip disposed in the through-hole and spaced apart from the semiconductor chip; a second connection member disposed on the first connection member, the dummy chip, and the active surface of the semiconductor chip; and an encapsulant encapsulating at least portions of the first connection member, the dummy chip, and the inactive surface of the semiconductor chip. The first connection member and the second connection member include, respectively, redistribution layers electrically connected to the connection pads.

20 Claims, 19 Drawing Sheets

(56) References Cited

U.S. PATENT DOCUMENTS

| | | |
|---|---|---|
| 2004/0012086 A1 | 1/2004 | Infantolino et al. |
| 2006/0125088 A1* | 6/2006 | Huang ................ H01L 21/4871 257/707 |
| 2010/0140779 A1* | 6/2010 | Lin .................... H01L 23/49816 257/690 |
| 2014/0300002 A1* | 10/2014 | Na ........................ H01L 23/481 257/774 |
| 2015/0008571 A1 | 1/2015 | Gallegos et al. |
| 2015/0035141 A1 | 2/2015 | Kim et al. |
| 2015/0137346 A1* | 5/2015 | Kwon ................ H01L 25/0657 257/723 |
| 2016/0118333 A1* | 4/2016 | Lin ........................ H01L 24/97 257/773 |
| 2017/0033062 A1* | 2/2017 | Liu ........................ H01L 23/66 |

\* cited by examiner

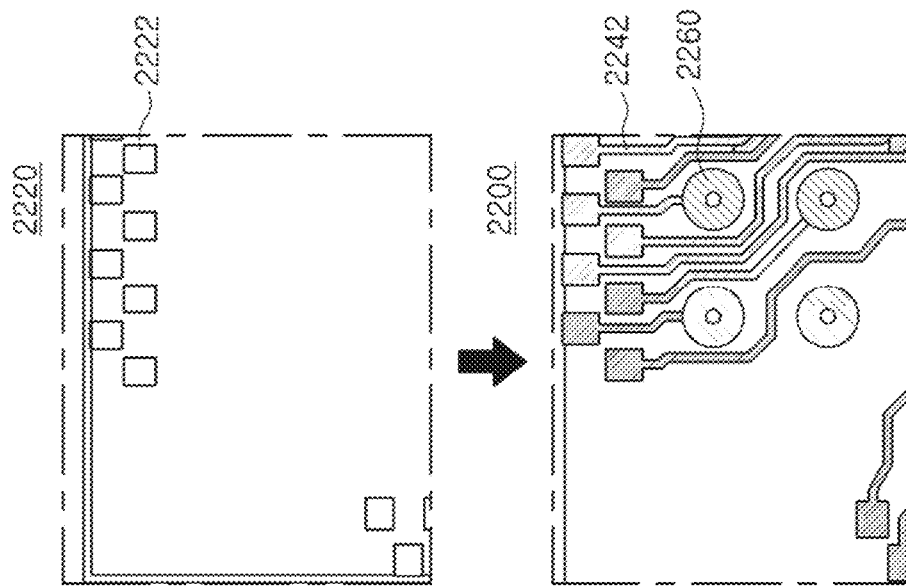
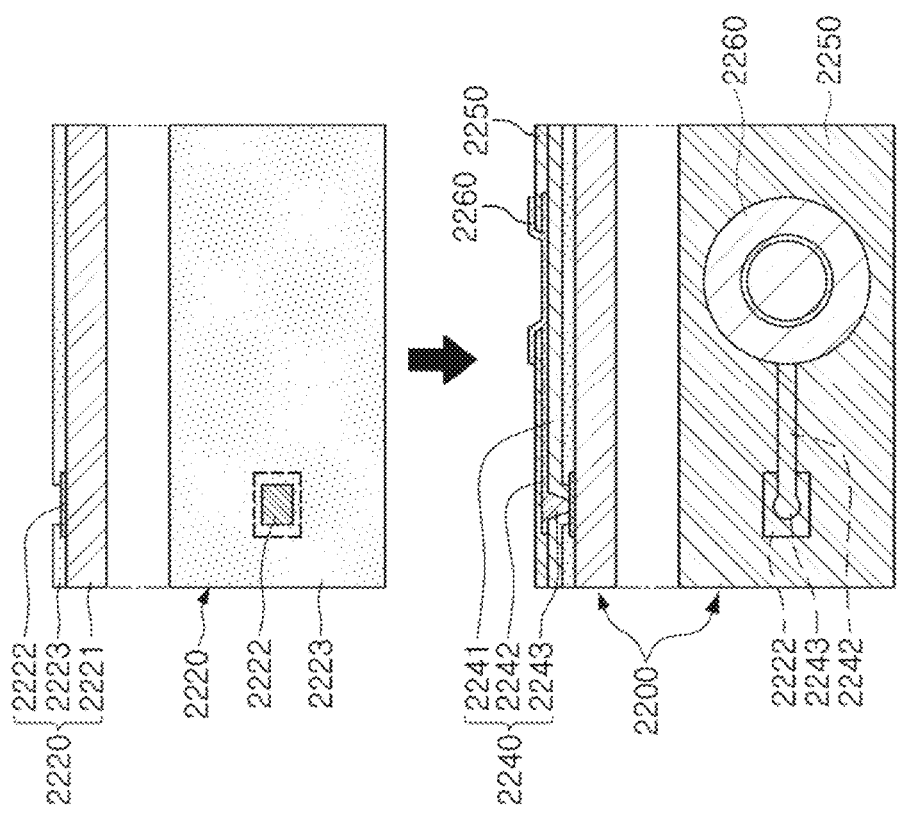
FIG. 3B
FIG. 3A

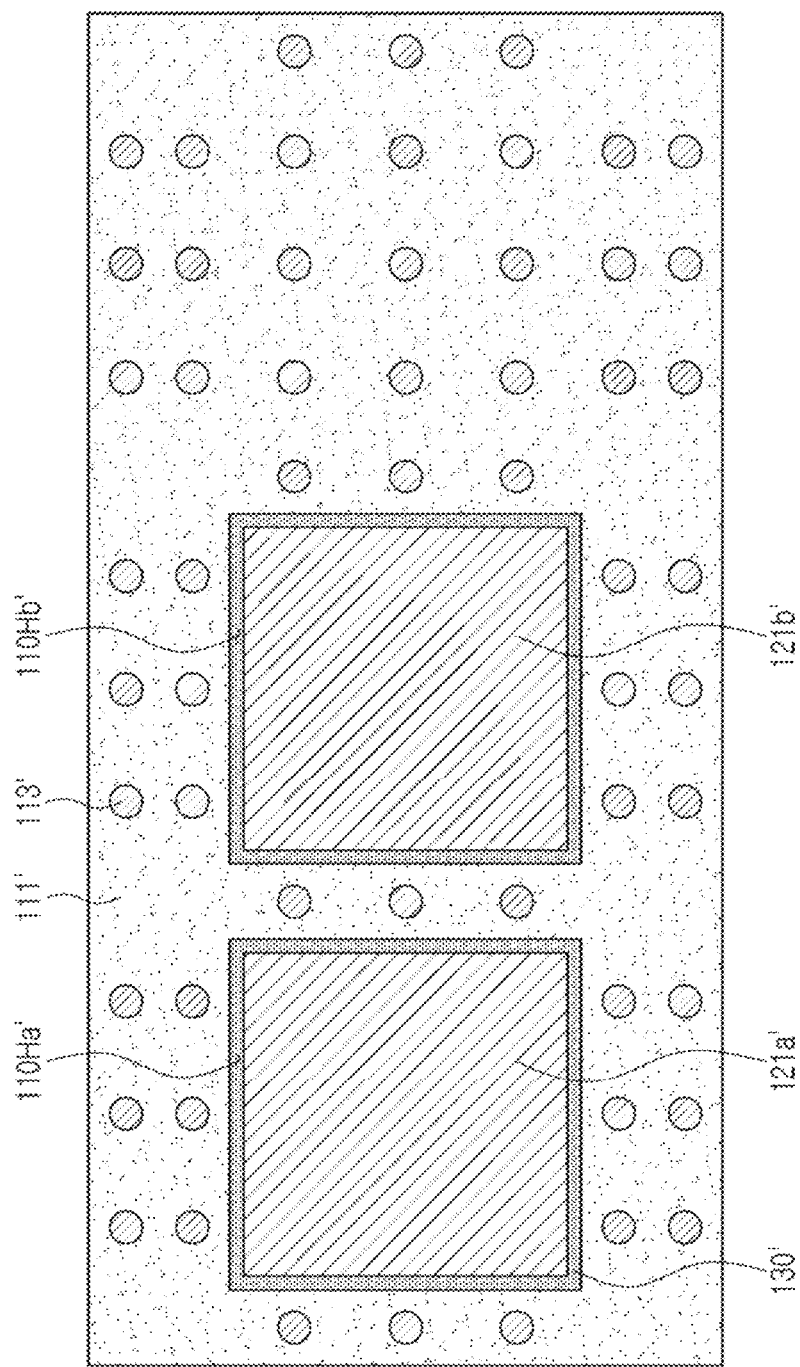

FAN-OUT SEMICONDUCTOR PACKAGE

CROSS-REFERENCE TO RELATED APPLICATION(S)

This application claims the benefit of priority to Korean Patent Application Nos. 10-2016-0102326 filed on Aug. 11, 2016 and 10-2016-0111922 filed on Aug. 31, 2016 in the Korean Intellectual Property Office, the entire disclosure of which is incorporated herein by reference.

BACKGROUND

1. Technical Field

The present disclosure relates to a semiconductor package, and more particularly, to a fan-out semiconductor package in which connection terminals may be extended outwardly of a region in which a semiconductor chip is disposed.

2. Description of Related Art

Recently, a significant recent trend in the development of semiconductor chip-related technology has been reducing the size of semiconductor chips. Therefore, in the area of package technology, in accordance with a rapid increase in demand for small-sized semiconductor chips, or the like, there has been increased demand for the implementation of a semiconductor package having a compact size while including a plurality of pins.

One type of package technology suggested to satisfy the technical demand as described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a fan-out semiconductor package in which a warpage problem may be effectively solved.

One of several solutions suggested in the present disclosure may be to dispose a dummy chip able to control warpage of a fan-out semiconductor package in a region in which a semiconductor chip is encapsulated.

According to an aspect of the present disclosure, a fan-out semiconductor package may include: a first connection member having a through-hole; a semiconductor chip disposed in the through-hole and having an active surface having connection pads disposed thereon and an inactive surface disposed to oppose the active surface; a dummy chip disposed in the through-hole and spaced apart from the semiconductor chip; a second connection member disposed on the first connection member, the dummy chip, and the active surface of the semiconductor chip; and an encapsulant encapsulating at least portions of the first connection member, the dummy chip, and the inactive surface of the semiconductor chip. The first connection member and the second connection member include, respectively, redistribution layers electrically connected to the connection pads.

BRIEF DESCRIPTION OF THE DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

FIG. 18 is a schematic plan view of the fan-out semiconductor package taken along line III-III' of FIG. 17;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
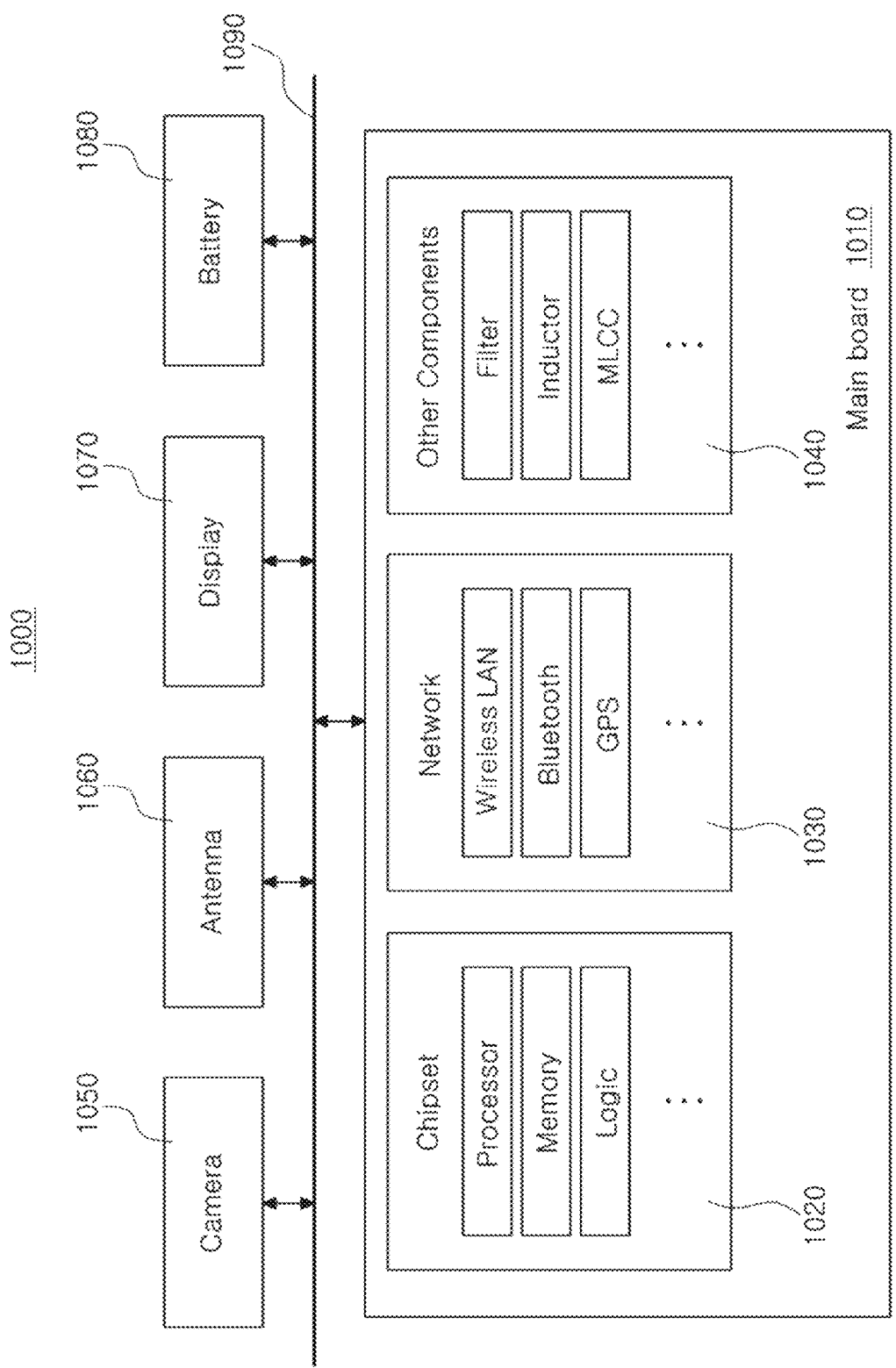
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010. The main board 1010 may include chip-related components 1020, network-related components 1030, other components 1040, and the like, physically or electrically connected thereto. These components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components 1020 are not limited thereto, and may include other types of chip related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may include passive components used for various other purposes, or the like. In addition, other components 1040 may be combined with each other, together with the chip-related components 1020 or the network-related components 1030 described above.

Depending on type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may include other components used for various purposes depending on type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
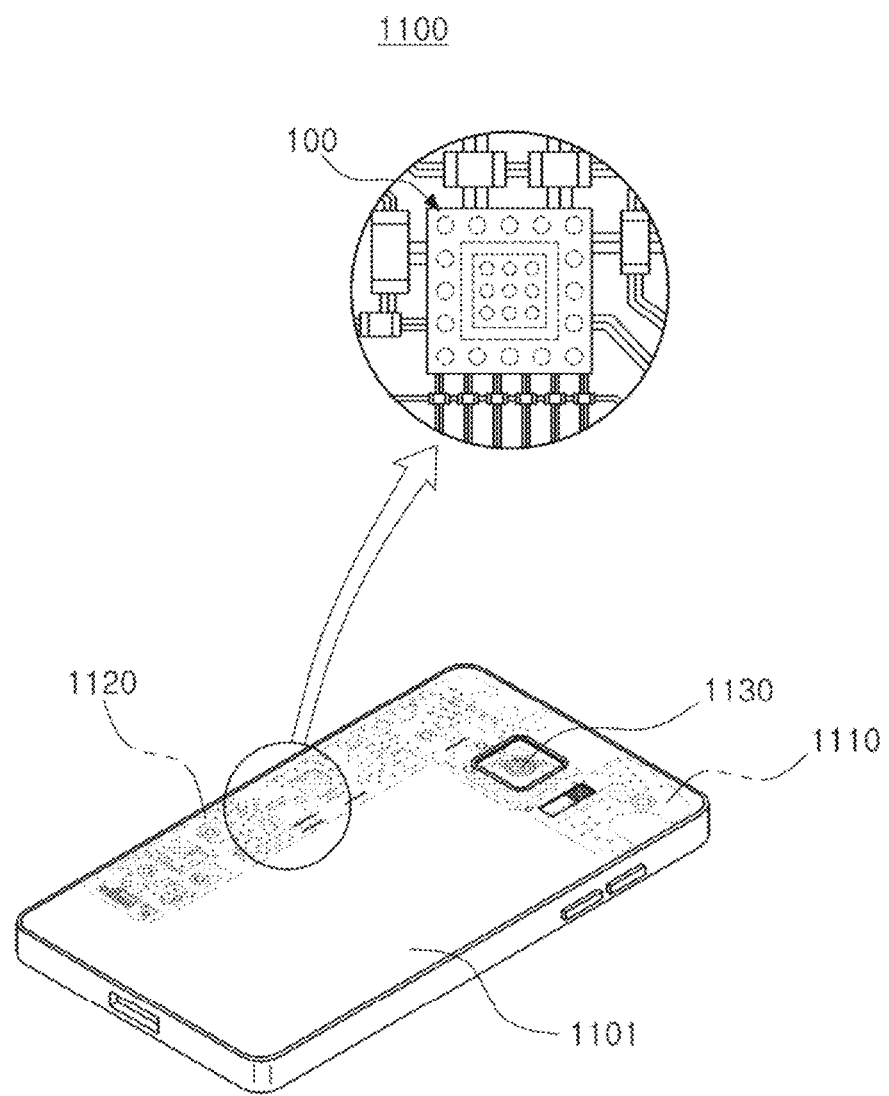
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1130, may be accommodated in the body 1101. Some of the electronic components 1120 may be the chip-related components 1020, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip is not generally used in a bare state, but is packaged and used in an electronic device, or the like, in a package state.

Semiconductor packaging is required due to a difference in a circuit width existing between the semiconductor chip and a main board of the electronic device with regard to electrical connectivity. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and a packaging technology for buffering a difference in a circuit width between the semiconductor chip and the main board is required.

A semiconductor package manufactured using packaging technology may be divided into a fan-in semiconductor package and a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
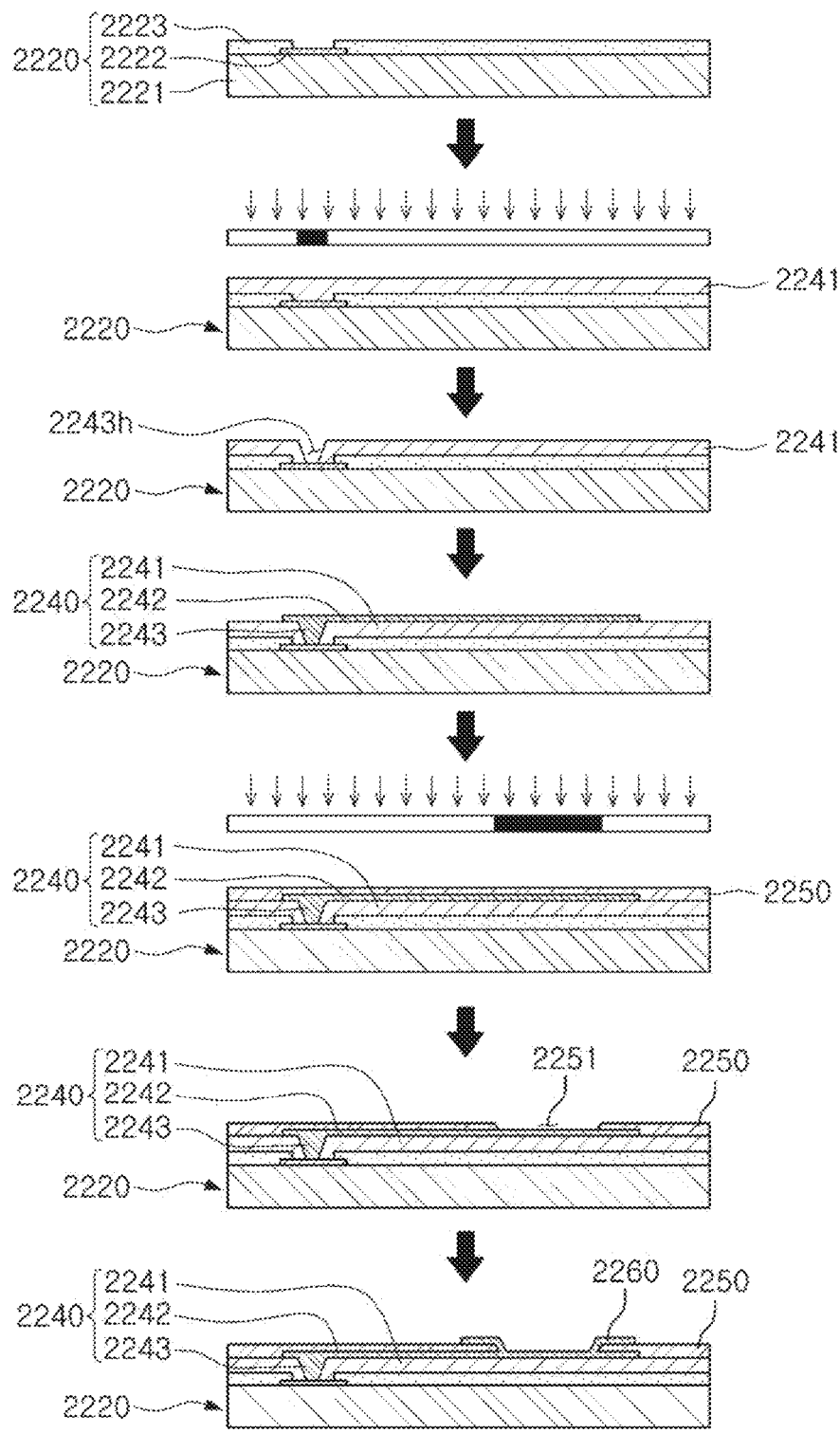
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. Here, since the connection pads 2222 are very small, it is difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads of the semiconductor chip, input/output (I/O) terminals for example, are disposed inside the semiconductor chip, may have excellent electrical characteristics and may be produced at low cost. Therefore, many elements mounted in a smartphone have been manufactured in fan-in semiconductor package form. In detail, many elements mounted in the smartphone have been developed to allow for rapid signal transfer while having a compact size.

However, since all of the I/O terminals need to be disposed inside the semiconductor chip in the fan-in semiconductor package, the fan-in semiconductor package has a significant spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the main board of the electronic device.

Figure 5:
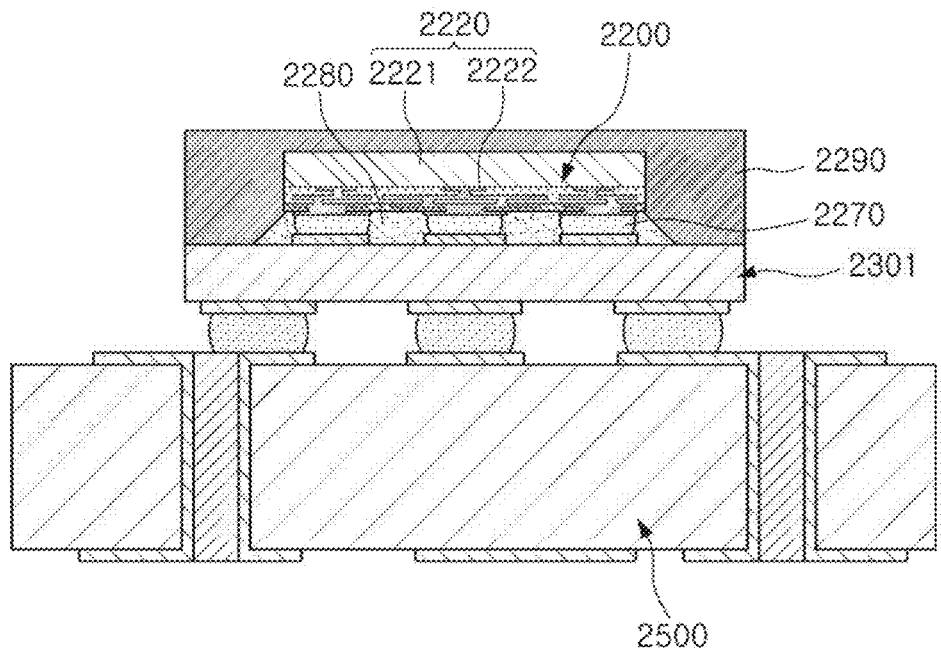
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
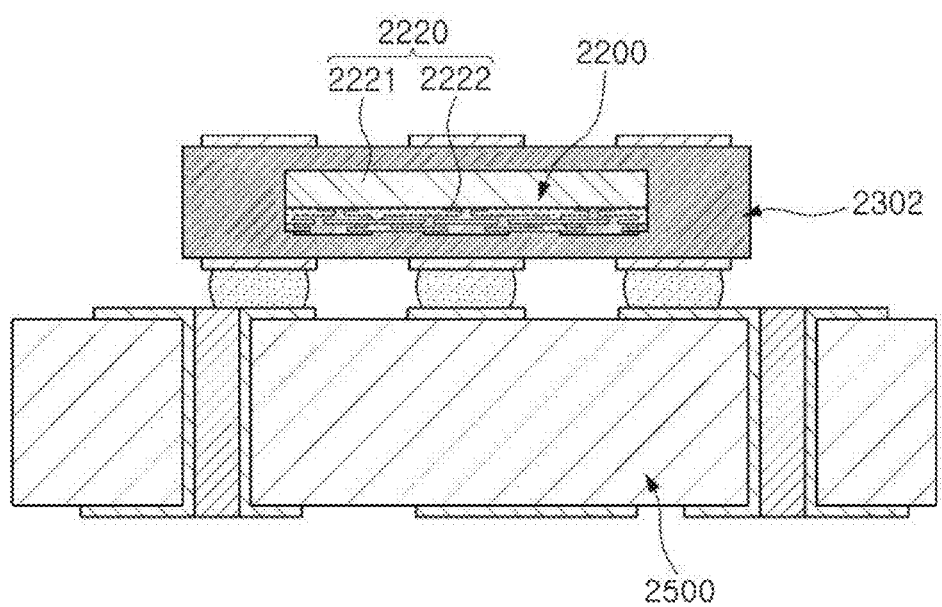
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. Here, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and may then be mounted on the main board of the electronic device through a packaging process or may be mounted and used on the main board of the electronic device in a state in which it is embedded in the interposer substrate.

Fan-Out Semiconductor Package

Figure 7:
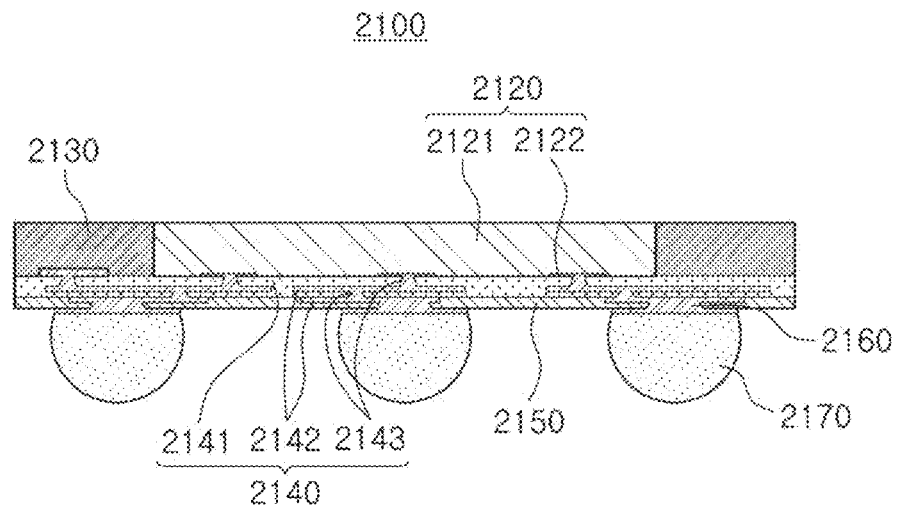
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all of the I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
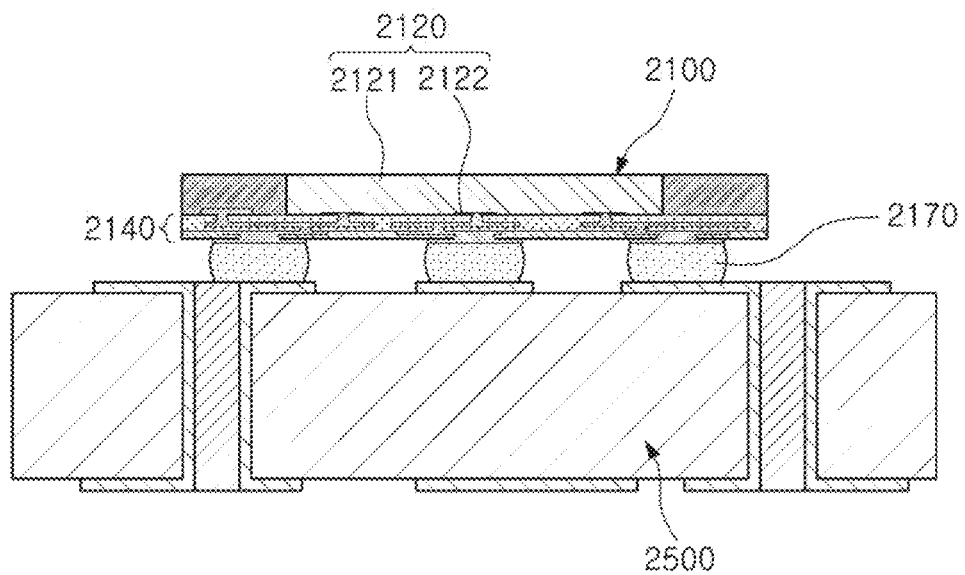
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 up to a fan-out region that is out of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

The fan-out semiconductor package refers to package technology for mounting the semiconductor chip on the main board of the electronic device, or the like, as described above, and protecting the semiconductor chip from external impacts, and which is conceptually different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a warpage problem may be effectively solved will hereinafter be described with reference to the drawings.

Figure 9:
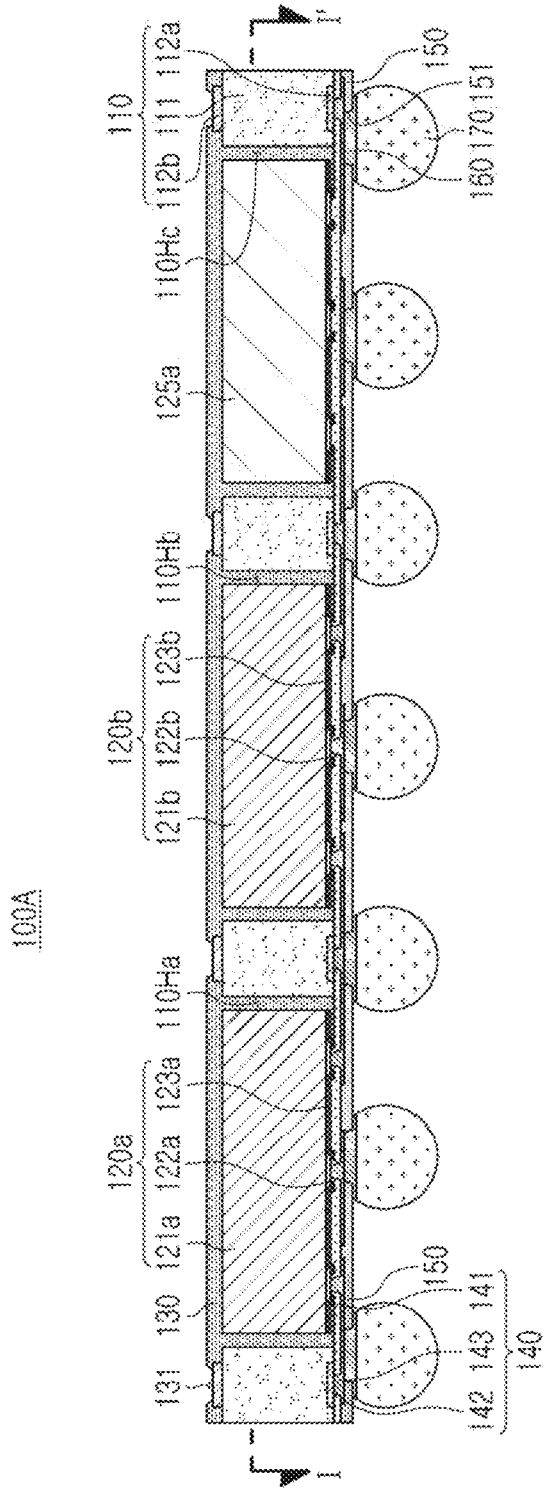
FIG. 9 is a schematic cross-sectional view illustrating an example of a fan-out semiconductor package.

FIG. 9 is a schematic cross-sectional view illustrating an example of a fan-out semiconductor package.

Figure 10:
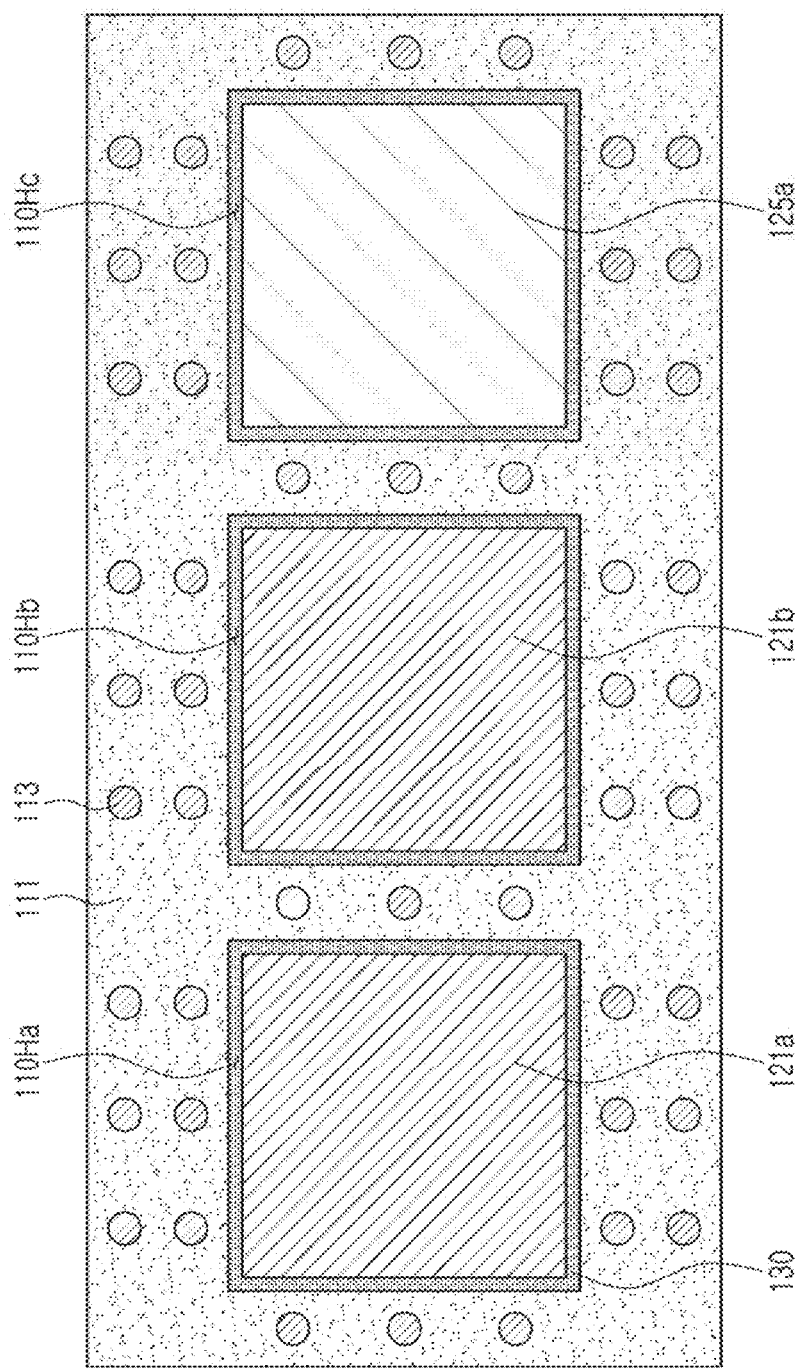
FIG. 10 is a schematic plan view of the fan-out semiconductor package taken along line I-I' of FIG. 9.

FIG. 10 is a schematic plan view of the fan-out semiconductor package taken along line I-I' of FIG. 9.

Referring to the drawings, a fan-out semiconductor package 100A according to an example may include a first connection member 110 having first to third through-holes 110Ha, 110Hb, and 110Hc, first and second semiconductor chips 120a and 120b disposed, respectively, in the first and second through-holes 110Ha and 110Hb of the first connection member 110 and having active surfaces having connection pads disposed thereon and inactive surfaces disposed to oppose the active surfaces, a dummy chip 125a disposed in the third through-hole 110Hc of the first connection member 110 and disposed in a region in which the first and second semiconductor chips 120a and 120b are not disposed, an encapsulant 130 encapsulating at least portions of the first connection member 110, the dummy chip 125a, and the inactive surfaces of the first and second semiconductor chips 120a and 120b, a second connection member 140 disposed on the first connection member 110, the dummy chip 125, and the active surfaces of the first and second semiconductor chips 120a and 120b, a passivation layer 150 disposed on the second connection member 140, an underbump metal layer 160 formed on openings 151 of the passivation layer 150, and connection terminals 170 disposed on the underbump metal layer 160.

Figure 17:
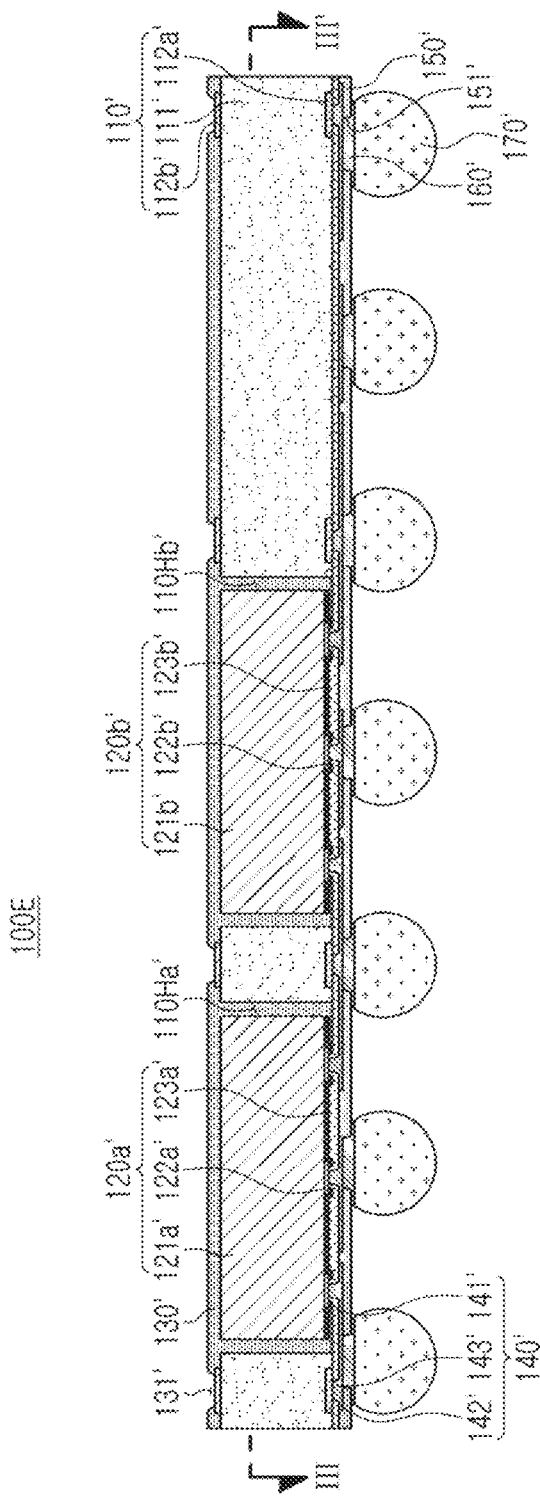
FIG. 17 is a schematic cross-sectional view illustrating an example of a fan-out semiconductor package in which a dummy chip is not disposed.

In a case in which semiconductor chips 120a' and 120b' are disposed in through-holes 110Ha' and 110Hb' of a first connection member 110', respectively, as illustrated in FIGS. 17 and 18, a coefficient of thermal expansion (CTE) of an insulating material of the first connection member 110' may be relatively larger than those of the semiconductor chips 120a' and 120b', such that warpage of a fan-out semiconductor package may be severely generated due to a CTE mismatch. Therefore, a surface mount technology (SMT) defect may occur in a process of mounting solder balls 170' or a defect due to interlayer interface delamination, or the like, may occur at the time of manufacturing a product. In order to solve the warpage problem described above, the semiconductor chips 120a' and 120b' may be disposed at the center of the fan-out semiconductor package and the semiconductor chips 120a' and 120b' may be disposed to be spaced apart from each other. However, in a case in which it is difficult to adjust the dispositions of the semiconductor chips 120a' and 120b' in a wiring design, that is, in a case in which the semiconductor chips 120a' and 120b' should be disposed to be biased to one side of the fan-out semiconductor package, warpage may be still problematic.

Figure 19A:
FIGS. 19A and 19B are schematic views illustrating warpage in a case in which a dummy chip is not disposed.
Figure 19B:
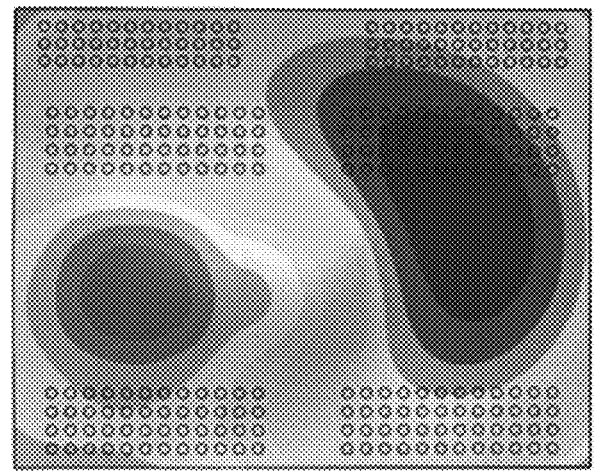

In the case in which the semiconductor chips 120a' and 120b' should be disposed to be biased to one side of the fan-out semiconductor package, when heat is applied to the fan-out semiconductor package in a reflow process, local warpage of a region in which the semiconductor chips 120a' and 120b' are disposed and local warpage of a region in which the semiconductor chips 120a' and 120b' are not disposed may be different from each other. That is, in a case in which local warpage is generated in the region in which the semiconductor chips 120a' and 120b' are disposed due to the semiconductor chips 120a' and 120b' disposed to be biased, local warpage may be generated in an opposite direction in the region in which the semiconductor chips 120a' and 120b' are not disposed. In this case, when warpage is improved in one direction, warpage in the other direction is deteriorated, such that it may be difficult to control overall warpage of the fan-out semiconductor package, as illustrated in FIGS. 19A and 19B.

Figure 20A:
FIGS. 20A and 20B are schematic views illustrating warpage in a case in which a dummy chip is disposed.
Figure 20B:
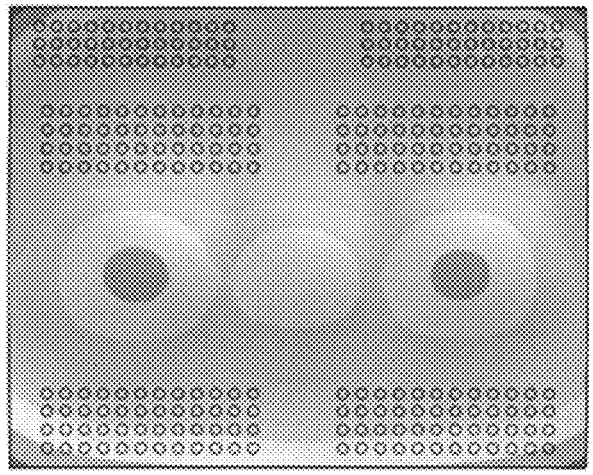

On the other hand, in a case in which the dummy chip 125a is disposed in the region in which the semiconductor chips 120a and 120b are not disposed even though one or more semiconductor chips 120a and 120b are disposed to be biased to one side of the fan-out semiconductor package 100A, as in the fan-out semiconductor package 100A according to an example, local warpages generated in different directions in two regions may be offset against each other. As a result, as illustrated in FIGS. 20A and 20B, overall warpage of the fan-out semiconductor package 100A may be improved. However, it may be advantageous in improving warpage at a room temperature, but it may be disadvantageous in controlling warpage at a high temperature process such as a reflow process to use the dummy chip 125a. That is, it may be difficult to control warpage at a high temperature rather than a room temperature by simply inserting the dummy chip 125a.

Therefore, the fan-out semiconductor package 100A according to an example may include the first connection member 110, and the first connection member 110 may be advantageous in maintaining rigidity of the fan-out semiconductor package 100A depending on a certain material or structure to facilitate the control of warpage at high temperature. In addition, the first connection member 110 may include a first redistribution layer 112a contacting the second connection member 140 and a second redistribution layer 112b contacting the encapsulant 130. In this case, a thickness of the second redistribution layer 112b disposed at a relatively higher level may be greater than that of the first redistribution layer 112a disposed at a relatively lower level, and a content of copper included in the second redistribution layer 112b disposed at the relatively higher level may be greater than that of copper included in the first redistribution layer 112a disposed at the relatively lower level. That is, an upper copper portion of the first connection member 110 may be larger than a lower copper portion of the first connection member 110. Therefore, rigidity of the first connection member 110 may be increased by rigidity increased by inserting the dummy chip 125a. Resultantly, warpage at both of the room temperature and the high temperature may be improved.

The respective components included in the fan-out semiconductor package 100A according to an example will hereinafter be described in more detail.

The first connection member 110 may maintain rigidity of the fan-out semiconductor package 100A, and serve to secure uniformity of a thickness of the encapsulant 130. In addition, the first connection member 110 may include the redistribution layers 112a and 112b redistributing connection pads 122a and 122b of the semiconductor chips 120a and 120b to thus reduce the number of layers of the second connection member 140. The first connection member 110 may have the through-holes 110Ha, 110Hb, and 110Hc. The through-holes 110Ha, 110Hb, and 110Hc may have the semiconductor chips 120a and 120b and the dummy chip 125a disposed therein, respectively, to be spaced apart from the first connection member 110 by a predetermined distance. Side surfaces of the semiconductor chips 120a and 120b and the dummy chip 125a may be surrounded by the first connection member 110. However, various modifications to another form may be made. In addition, the first connection member 110 may perform another function depending on a form thereof.

The first connection member 110 may include an insulating layer 111 contacting the second connection member 140, the first redistribution layer 112a contacting the second connection member 140 and embedded in the insulating layer 111, and the second redistribution layer 112b disposed on the other surface of the insulating layer 111 opposing one surface of the insulating layer 111 in which the first redistribution layer 112a is embedded. In addition, the first connection member 110 may include vias 113 penetrating through the insulating layer 111 and electrically connecting the first and second redistribution layers 112a and 112b to each other. Meanwhile, since the first redistribution layer 112a is embedded in the insulating layer 111, an insulating distance of an insulating layer 141 of the second connection member 140 may be relatively constant as compared to a case in which the first redistribution layer 112a is not embedded in the insulating layer 111.

A material of the insulating layer 111 is not particularly limited. For example, an insulating material may be used as a material of the insulating layer 111. In this case, the insulating material may be a thermosetting resin such as an epoxy resin, a thermoplastic resin such as a polyimide resin, a resin in which the thermosetting resin or the thermoplastic resin is impregnated with an inorganic filler in a core material such as a glass cloth (or a glass fabric), for example, prepreg, Ajinomoto Build up Film (ABF), FR-4, Bismaleimide Triazine (BT), or the like. Alternatively, a photoimagable dielectric (PID) resin to which a photolithography method may be applied may also be used as the insulating material.

The redistribution layers 112a and 112b may serve to redistribute the connection pads 122a and 122b of the semiconductor chips 120a and 120b, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 112a and 112b. The redistribution layers 112a and 112b may perform various functions depending on designs of their corresponding layers. For example, the redistribution layers 112a and 112b may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a and 112b may include via pads, connection terminal pads, and the like.

A surface treatment layer (not illustrated) may further be formed on portions of the redistribution layer 112b exposed from the redistribution layers 112a and 112b through openings 131 formed in the encapsulant 130, if necessary. The surface treatment layer (not illustrated) is not particularly limited as long as it is known in the related art, and may be formed by using, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

A thickness of the second redistribution layer 112b may be greater than that of the first redistribution layer 112a. In addition, a content of copper included in the second redistribution layer 112b may be greater than that of copper included in the first redistribution layer 112a. The first connection member 110 may be introduced, such that the warpage of the fan-out semiconductor package 100A may be more effectively controlled together with the dummy chip 125a. Here, in a case in which the second redistribution layer 112b is designed to be greater than the first redistribution layer 112a and have a copper portion larger than that of the first redistribution layer 112a, warpage at high temperature may be more effectively controlled.

The vias 113 may electrically connect the redistribution layers 112a and 112b formed on different layers, resulting in an electrical path in the first connection member 110. A conductive material such as copper (Cu), aluminum (Al), silver (Ag), tin (Sn), gold (Au), nickel (Ni), lead (Pb), titanium (Ti), or alloys thereof, may be used as a material of each of the vias 113. The via 113 may be entirely filled with the conductive material, or the conductive material may be formed along a wall of a via hole. In addition, each of the vias 113 may have all of the shapes known in the related art, such as a tapered shape, a cylindrical shape, and the like. When holes for the vias 113 are formed, some of the pads of the first redistribution layer 112a may serve as a stopper, and it may be thus advantageous in a process that each of the vias 113 has the tapered shape of which a width of an upper surface is greater than that of a lower surface. In this case, the vias 113 may be integrated with portions of the second redistribution layer 112b.

The semiconductor chips 120a and 120b may be an integrated circuit (IC) provided in an amount of several hundreds to several millions of elements or more integrated in a single chip. As a non-restrictive example, the first semiconductor chip 120a may be a memory chip such as a dynamic random access memory (DRAM), or the like, and the second semiconductor chip 120b may be a controller chip. However, the first semiconductor chip 120a and the second semiconductor chip 120b are not limited thereto.

The semiconductor chips 120a and 120b may be formed on the basis of an active wafer. In this case, a base material of each of bodies 121a and 121b of the semiconductor chips 120a and 120b may be silicon (Si), germanium (Ge), gallium arsenide (GaAs), or the like. Various circuits may be formed on the bodies 121a and 121b. The connection pads 122a and 122b may electrically connect the semiconductor chips 120a and 120b to other components, and a conductive material such as aluminum (Al), or the like, may be used as a material of each of the connection pads 122a and 122b. Passivation layers 123a and 123b exposing the connection pads 122a and 122b may be formed on the bodies 121a and 121b, respectively, and may be oxide films, nitride films, or the like, or double layers of oxide films and nitride films. Lower surfaces of the connection pads 122a and 122b may have a step with respect to a lower surface of the encapsulant 130 through the passivation layers 123a and 123b. Resultantly, a phenomenon in which the encapsulant 130 is bled to the lower surfaces of the connection pads 122a and 122b may be prevented to some degree. An insulating layer (not illustrated), and the like, may also be further disposed in other required positions. Meanwhile, one surfaces of the semiconductor chips 120a and 120b on which the connection pads 122a and 122b are formed may be active surfaces, and the other surfaces of the semiconductor chips 120a and 120b opposing one surfaces of the semiconductor chips 120a and 120b may be inactive surfaces.

The dummy chip 125a may be formed of a material similar to that of each of the semiconductor chips 120a and 120b. Therefore, a material, a shape, or the like, of the dummy chip 125 is not particularly limited as long as the dummy chip 125 may control local warpage. For example, the dummy chip 125a may also be an IC provided in an amount of several hundreds to several millions of elements or more integrated in a single chip. The dummy chip 125a may have any another function as long as it may serve as a dummy element. The dummy chip 125a may be electrically insulated from the semiconductor chips 120a and 120b.

The encapsulant 130 may protect the first connection member 110, the semiconductor chips 120a and 120b, and the dummy chip 125a. An encapsulation form of the encapsulant 130 is not particularly limited, but may be a form in which the encapsulant 130 surrounds at least portions of the first connection member 110, the semiconductor chips 120a and 120b, and the dummy chip 125a. For example, the encapsulant 130 may cover upper portions of the first connection member 110, the semiconductor chips 120a and 120b, and the dummy chip 125a, and fill spaces between walls of the through-holes 110Ha, 110Hb, and 110Hc and side surfaces of the semiconductor chips 120a and 120b and the dummy chip 125a. In addition, the encapsulant 130 may also fill at least portions of spaces between the passivation layers 123a and 123b of the semiconductor chips 120a and 120b and the second connection member 140. Meanwhile, the encapsulant 130 may fill the through-holes 110Ha, 110Hb, and 110Hc to thus serve as an adhesive and reduce buckling of the semiconductor chips 120a and 120b and the dummy chip 125a depending on materials.

The materials of the encapsulant 130 are not particularly limited. For example, an insulating material may be used to form the encapsulant 130. In this case, the insulating material may be a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, a known molding material such as an EMC, or the like, may also be used.

Several tens to several hundreds of connection pads 122a and 122b having various functions may be redistributed by the second connection member 140, and may be physically or electrically connected to an external source through connection terminals 170 to be described below depending on the functions. The second connection member 140 may include insulating layers 141, redistribution layers 142 disposed on the insulating layers 141, and vias 143 penetrating through the insulating layers 141 and connecting the redistribution layers 142 to each other. In the fan-out semiconductor package 100A according to an example, the second connection member 140 may be formed of a single layer, but is not limited thereto. Therefore, the second connection member 140 may also be formed of a plurality of layers.

An insulating material may be used as a material of the insulating layers 141. In this case, in addition to the insulating material as described above, a photosensitive insulating material such as a PID resin may also be used as the insulating material. In this case, the insulating layer 141 may be formed to have a smaller thickness, and a fine pitch of the vias 143 may be achieved more easily. In a case in which the number of insulating layers 141 is plural, insulating materials of the respective layers may be the same as each other, and may also be different from each other, if necessary. In addition, the plurality of insulating layers may be integrated with each other depending on a process, such that boundaries therebetween may not be readily apparent.

The redistribution layers 142 may substantially serve to redistribute the connection pads 122a and 122b, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 142. The redistribution layers 142 may perform various functions depending on designs of their corresponding layers. For example, the redistribution layers 142 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142 may include via pads, connection terminal pads, and the like.

A surface treatment layer (not illustrated) may further be formed on portions of patterns exposed from the redistribution layers 142, if necessary. The surface treatment layer (not illustrated) is not particularly limited as long as it is known in the related art, and may be formed by using, for example, electrolytic gold plating, electroless gold plating, OSP or electroless tin plating, electroless silver plating, electroless nickel plating/substituted gold plating, DIG plating, HASL, or the like.

The vias 143 may electrically connect the redistribution layers 142, the connection pads 122a and 122b, or the like, formed on different layers, resulting in an electrical path in the fan-out semiconductor package 100A. A conductive material such as copper (Cu), aluminum (Al), silver (Ag), tin (Sn), gold (Au), nickel (Ni), lead (Pb), titanium (Ti), or alloys thereof, may be used as a material of each of the vias 143. The via 143 may be entirely filled with the conductive material, or the conductive material may also be formed along a wall of the via. In addition, the via 143 may have all of the shapes known in the related art, such as a tapered shape, a cylindrical shape, and the like.

Thicknesses of the redistribution layers 112a and 112b of the first connection member 110 may be greater than those of the redistribution layers 142 of the second connection member 140. Since the first connection member 110 may have a thickness equal to or greater than those of the semiconductor chips 120a and 120b, the redistribution layers 112a and 112b formed in the first connection member 110 may be formed to be relatively large, depending on a scale of the first connection member 110. On the other hand, the redistribution layer 142 of the second connection member 140 may be formed to be relatively small, for thinness.

The passivation layer 150 may additionally be configured to protect the second connection member 140 from external physical or chemical damage. The passivation layer 150 may have the openings 151 exposing at least some of patterns of the redistribution layer 142 of the second connection member 140. The openings 151 may expose the entirety or only a portion of a surface of the redistribution layer 142. A material of the passivation layer 150 is not particularly limited, but may be a photosensitive insulating material such as a PID resin. Alternatively, a solder resist may also be used as a material of the passivation layer 150. Alternatively, ABF that does not include a core material, but includes an inorganic filler and an insulating resin may be used as a material of the passivation layer 150.

The underbump metal layer 160 may additionally be configured to improve connection reliability of the connection terminals 170 to improve board level reliability. The underbump metal layer 160 may be disposed on walls in the openings 151 of the passivation layer 150 and the exposed redistribution layer 142 of the second connection member 140. The underbump metal layer 160 may be formed by a known metallization method using a known conductive material such as a metal. The underbump metal layer 160 may include a plurality of vias in some cases. In this case, reliability may be improved. A dimple directed inwardly may be formed in each of the plurality of vias. In this case, reliability may be improved.

The connection terminals 170 may additionally be configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material such as a solder, or the like. However, this is only an example, and a material of each of the connection terminals 170 is not limited thereto. Each of the connection terminals 170 may be a land, a ball, a pin, or the like. The connection terminal 170 may be formed of multiple layers or a single layer. When the connection terminals 170 are formed of the multiple layers, the connection terminals 170 may include a copper pillar and a solder. When the connection terminals 170 are formed of the single layer, the connection terminals 170 may include a tin-silver solder or copper. However, this is only an example, and the connection terminals 170 are not limited thereto. The number, an interval, a disposition form, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122a and 122b of the semiconductor chips 120a and 120b, but are not limited thereto, and may also be provided in an amount of several tens to several thousands or more or several tens to several thousands or less.

At least one of the connection terminals 170 may be disposed in a fan-out region. The fan-out region is a region except for the region in which the semiconductor chips 120a and 120b are disposed. That is, the fan-out semiconductor package 100A according to an example may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Although not illustrated, metal layers may also be formed on walls of the through-holes 110HA, 110Hb, and 110Hc, if necessary, in order to radiate heat and block electromagnetic interference (EMI). In addition, separate passive components (not illustrated) such as a condenser, an inductor, and the like, may be disposed and encapsulated in the through-holes 110Ha, 110Hb, and 110Hc, in addition to the semiconductor chips 120a and 120b and the dummy chip 125a. In addition, a surface mount technology component (not illustrated) may be mounted on the passivation layer 150.

Figure 11:
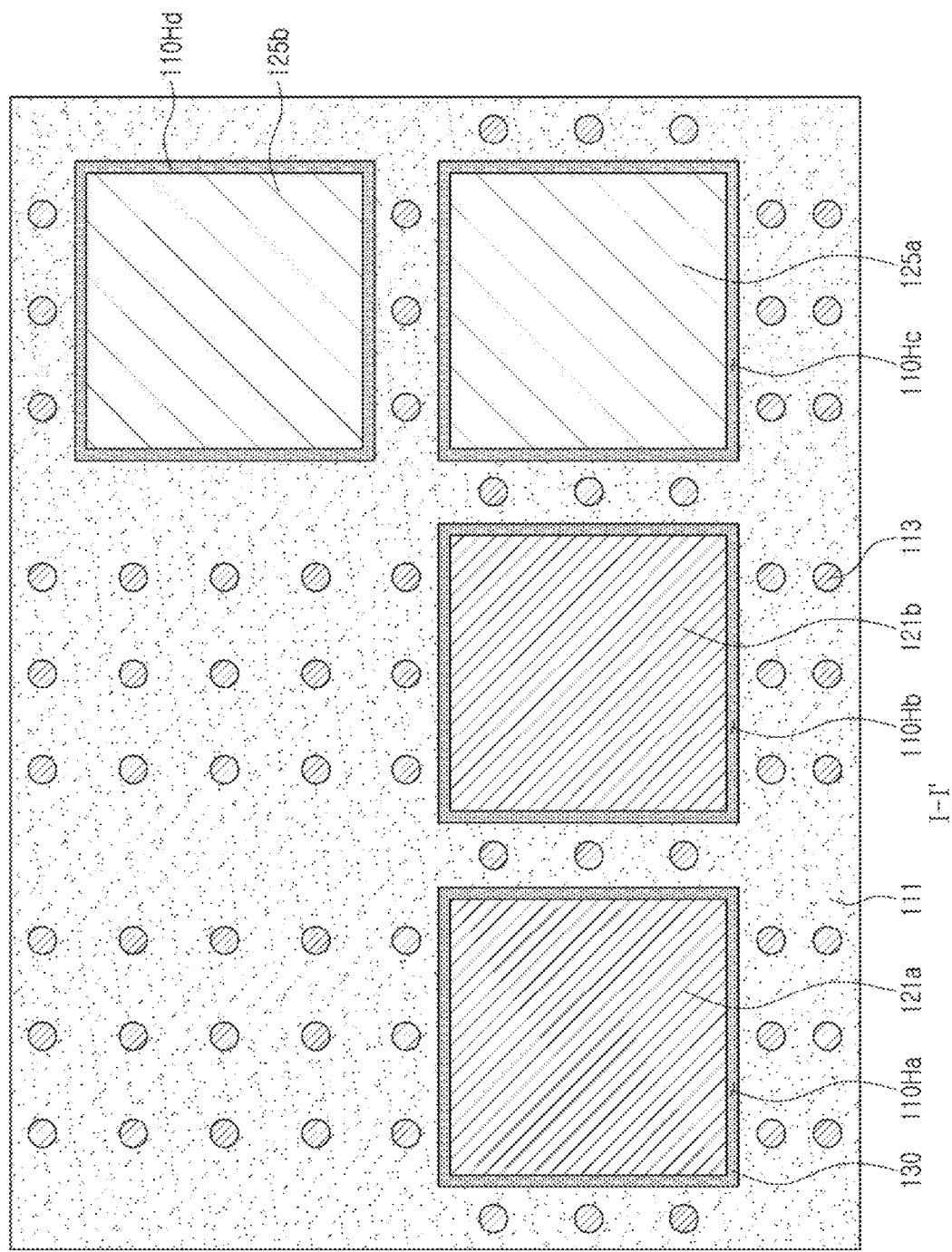
FIG. 11 is another schematic plan view of the fan-out semiconductor package taken along line I-I' of FIG. 9.

FIG. 11 is another schematic plan view of the fan-out semiconductor package taken along line I-I' of FIG. 9.

Referring to the drawing, the fan-out semiconductor package 100A according to an example may include a larger number of through-holes 110Ha, 110Hb, 110Hc, and 110Hd, and may include a larger number of dummy chips 125a and 125b. That is, depending on a size of the fan-out semiconductor package or a disposition form of the semiconductor chips 120a and 120b included in the fan-out semiconductor package, a larger number of dummy chips 125a and 125b may also be disposed in order to control warpage.

Figure 12:
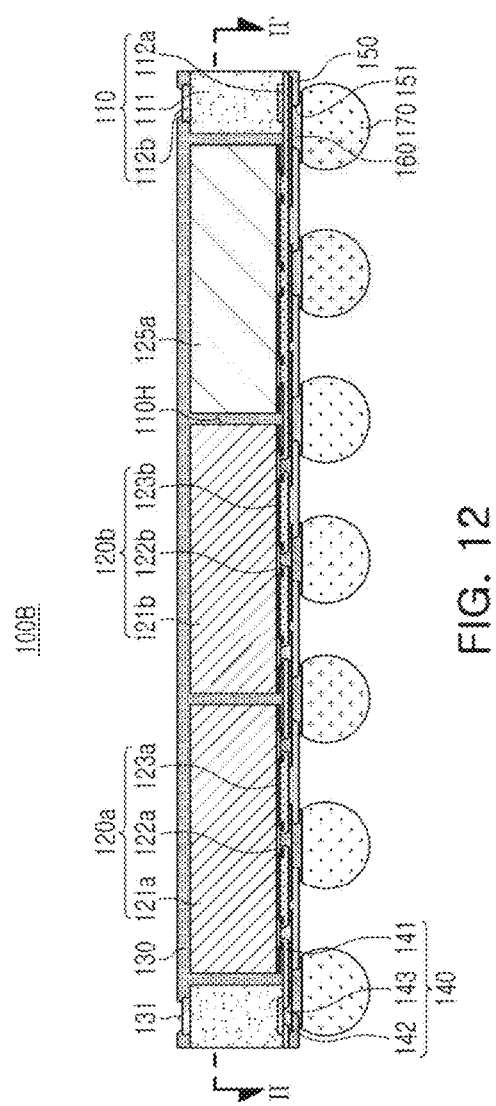
FIG. 12 is a schematic cross-sectional view illustrating another example of a fan-out semiconductor package.

FIG. 12 is a schematic cross-sectional view illustrating another example of a fan-out semiconductor package.

Figure 13:
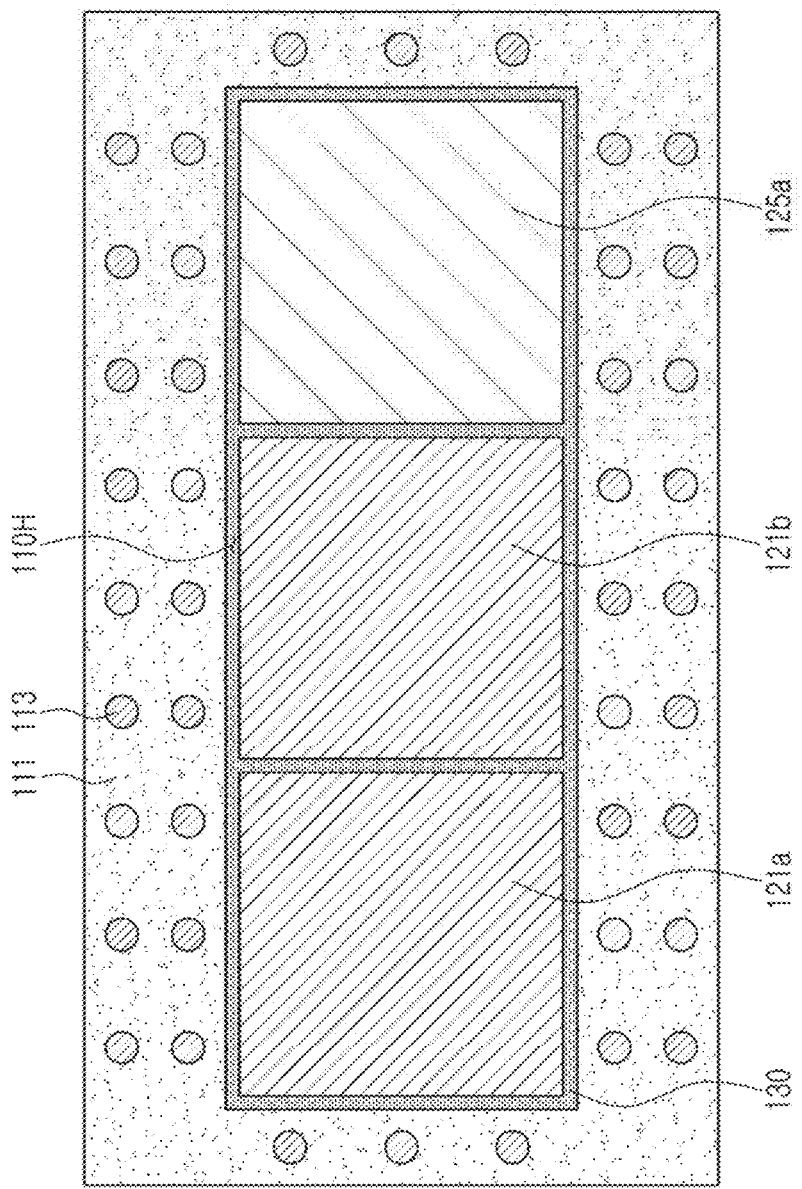
FIG. 13 is a schematic plan view of the fan-out semiconductor package taken along line II-II' of FIG. 12.

FIG. 13 is a schematic plan view of the fan-out semiconductor package taken along line II-II' of FIG. 12.

Referring to the drawings, a fan-out semiconductor package 100B according to another example may include a first connection member 110 having a through-hole 110H, first and second semiconductor chips 120a and 120b disposed together with each other in the through-hole 110H of the first connection member 110 and having an active surface having connection pads disposed thereon and an inactive surface disposed to oppose the active surfaces, a dummy chip 125a disposed together with the first and second semiconductor chips 120a and 120b in the through-hole 110H of the first connection member 110 and disposed in a region in which the first and second semiconductor chips 120a and 120b are not disposed, an encapsulant 130 encapsulating at least portions of the first connection member 110, the dummy chip 125a, and the inactive surfaces of the first and second semiconductor chips 120a and 120b, a second connection member 140 disposed on the first connection member 110, the dummy chip 125, and the active surfaces of the first and second semiconductor chips 120a and 120b, a passivation layer 150 disposed on the second connection member 140, an underbump metal layer 160 formed on openings 151 of the passivation layer 150, and connection terminals 170 disposed on the underbump metal layer 160.

In a case in which the dummy chip 125a is disposed in the region in which the semiconductor chips 120a and 120b are not disposed even though one or more semiconductor chips 120a and 120b are disposed to be biased to one side of the fan-out semiconductor package 100B, as in the fan-out semiconductor package 100B according to another example, local warpages generated in different directions in two regions may be offset against each other. Resultantly, overall warpage of the fan-out semiconductor package 100B may be improved.

Descriptions of configurations overlapping the previously described configuration will be omitted. Meanwhile, a structure of the fan-out semiconductor package 100A according to an example and a structure of the fan-out semiconductor package 100B according to another example may be combined with each other, if necessary, as long as they do not conflict with each other.

Figure 14:
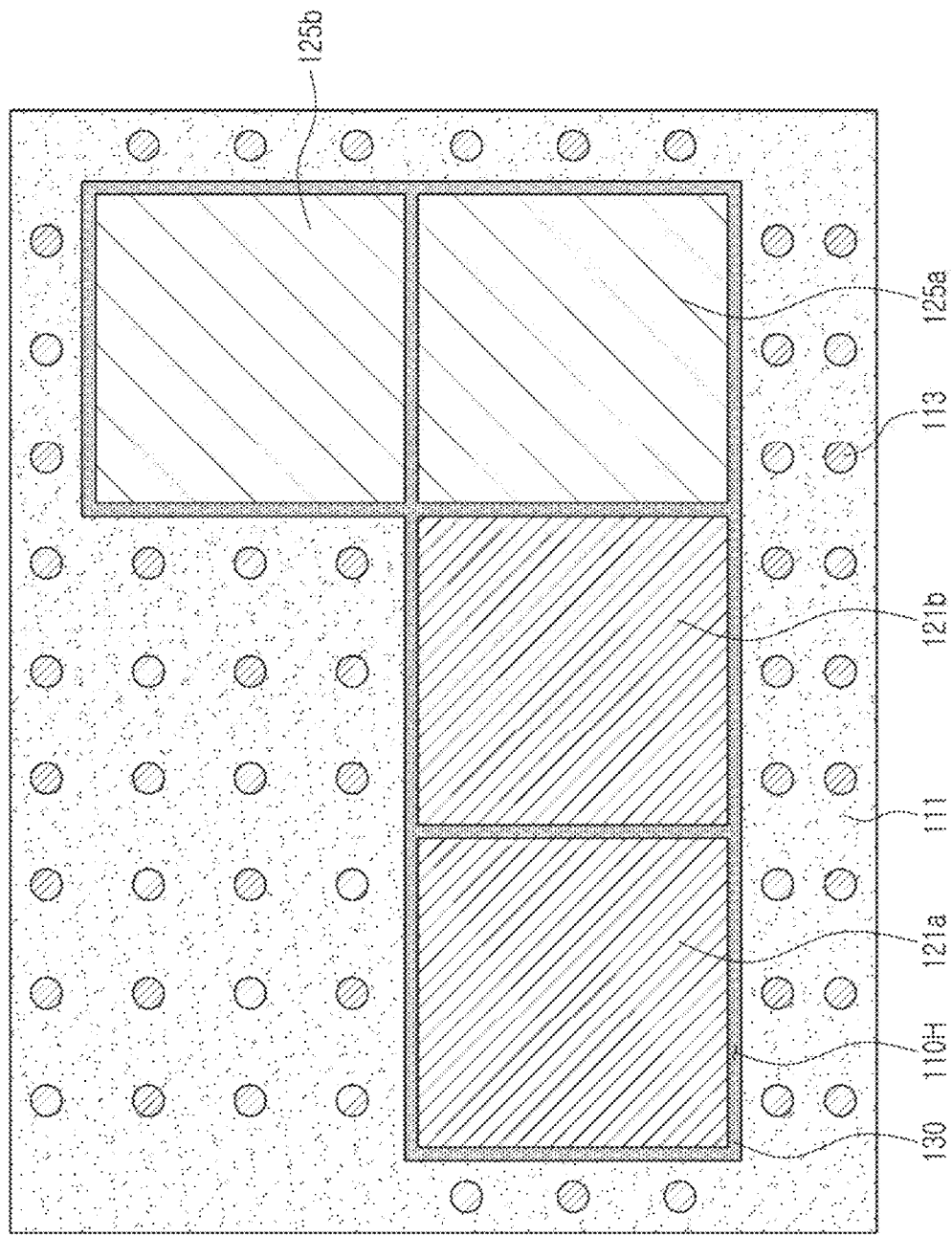
FIG. 14 is another schematic plan view of the fan-out semiconductor package taken along line II-II' of FIG. 12.

FIG. 14 is another schematic plan view of the fan-out semiconductor package taken along line II-II' of FIG. 12.

Referring to the drawing, the fan-out semiconductor package 100B according to another example may also include a larger number of dummy chips 125a and 125b disposed in the through-hole 110H. That is, depending on a size of the fan-out semiconductor package or a disposition form of the semiconductor chips 120a and 120b included in the fan-out semiconductor package, a larger number of dummy chips 125a and 125b may also be disposed in order to control warpage.

Figure 15:
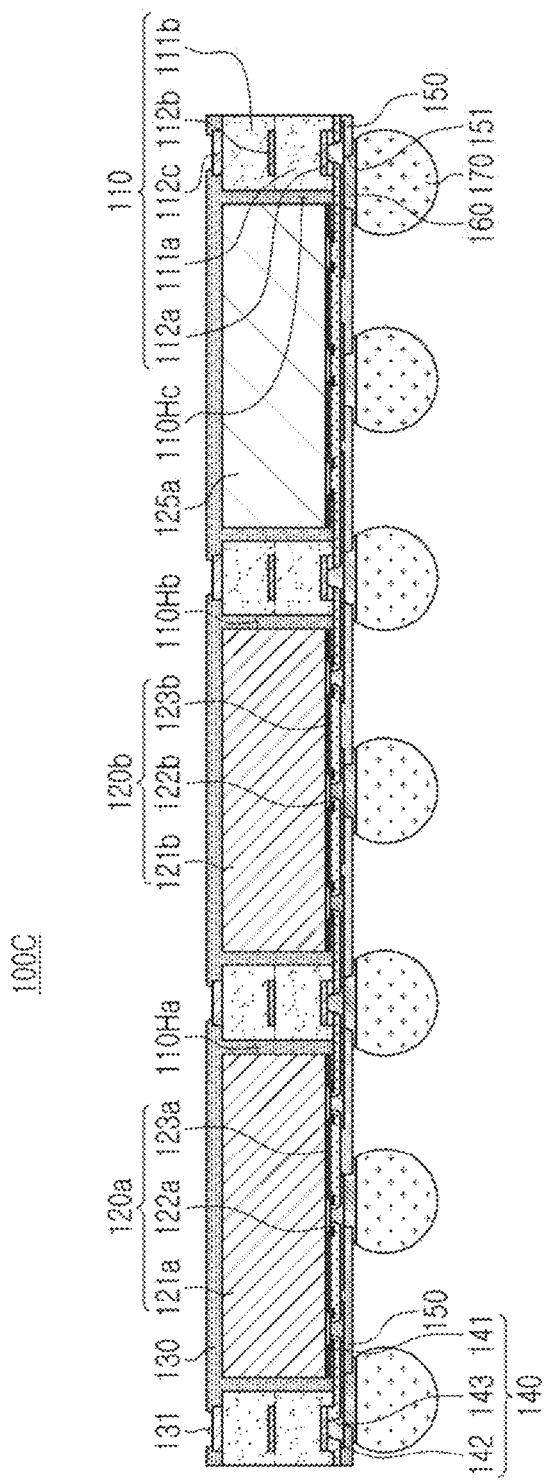
FIG. 15 is a schematic cross-sectional view illustrating another example of a fan-out semiconductor package.

FIG. 15 is a schematic cross-sectional view illustrating another example of a fan-out semiconductor package.

Referring to the drawing, in a fan-out semiconductor package 100C according to another example, a first connection member 110 may include a first insulating layer 111a contacting a second connection member 140, a first redistribution layer 112a contacting the second connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122a and 122b. Meanwhile, the first and second redistribution layers 112a and 112b and the second and third redistribution layers 112b and 112c may be electrically connected to each other through first and second vias (not illustrated) penetrating through the first and second insulating layers 111a and 111b, respectively.

Since the first redistribution layer 112a is embedded in the first insulating layer 111a, an insulating distance of an insulating layer 141 of the second connection member 140 may be substantially constant, as described above. Since the first connection member 110 may include a large number of redistribution layers 112a, 112b, and 112c, the second connection member 140 may be further simplified. Therefore, a decrease in yield depending on a defect occurring in a process of forming the second connection member 140 may be improved. The first redistribution layer 112a may be recessed in the first insulating layer 111a, such that a lower surface of the first insulating layer 111a may have a step with respect to a lower surface of the first redistribution layer 112a. Resultantly, when an encapsulant 130 is formed, a phenomenon in which a material of the encapsulant 130 is bled, polluting the first redistribution layer 112a, may be prevented.

The lower surface of the first redistribution layer 112a of the first connection member 110 may be disposed on a level higher than a lower surface of the connection pad 122 of the semiconductor chip 120. In addition, a distance between a redistribution layer 142 of the second connection member 140 and the first redistribution layer 112a of the first connection member 110 may be greater than that between the redistribution layer 142 of the second connection member 140 and the connection pads 122 of the semiconductor chip 120. The reason is that the first redistribution layer 112a may be recessed in the first insulating layer 111a. The second redistribution layer 112b of the first connection member 110 may be disposed on a level between an active surface and an inactive surface of the semiconductor chip 120. The first connection member 110 may be formed at a thickness corresponding to that of the semiconductor chip 120. Therefore, the second redistribution layer 112b formed in the first connection member 110 may be disposed on a level between the active surface and the inactive surface of the semiconductor chip 120.

Thicknesses of the redistribution layers 112a, 112b, and 112c of the first connection member 110 may be greater than that of the redistribution layer 142 of the second connection member 140. Since the first connection member 110 may have a thickness equal to or greater than that of the semiconductor chip 120, the redistribution layers 112a, 112b, and 112c may be formed to be relatively large, depending on a scale of the first connection member 110. The redistribution layer 142 of the second connection member 140 may be formed to be relatively small, for thinness.

A thickness of the third redistribution layer 112c may be greater than that of the first redistribution layer 112a. In addition, a content of copper included in the third redistribution layer 112c may be greater than that of copper included in the first redistribution layer 112a. The first connection member 110 may be introduced, such that warpage of the fan-out semiconductor package 100C may be more effectively controlled together with the dummy chip 125a. Here, in a case in which the third redistribution layer 112c disposed at a relatively highest level is designed to be greater than the first redistribution layer 112a disposed at a relatively lowest level and have a copper portion larger than that of the first redistribution layer 112a, warpage at high temperature may be more effectively controlled.

Descriptions of configurations overlapping the previously described configuration will be omitted. Meanwhile, the description of the fan-out semiconductor package 100B described above may also be applied to the fan-out semiconductor package 100C.

Figure 16:
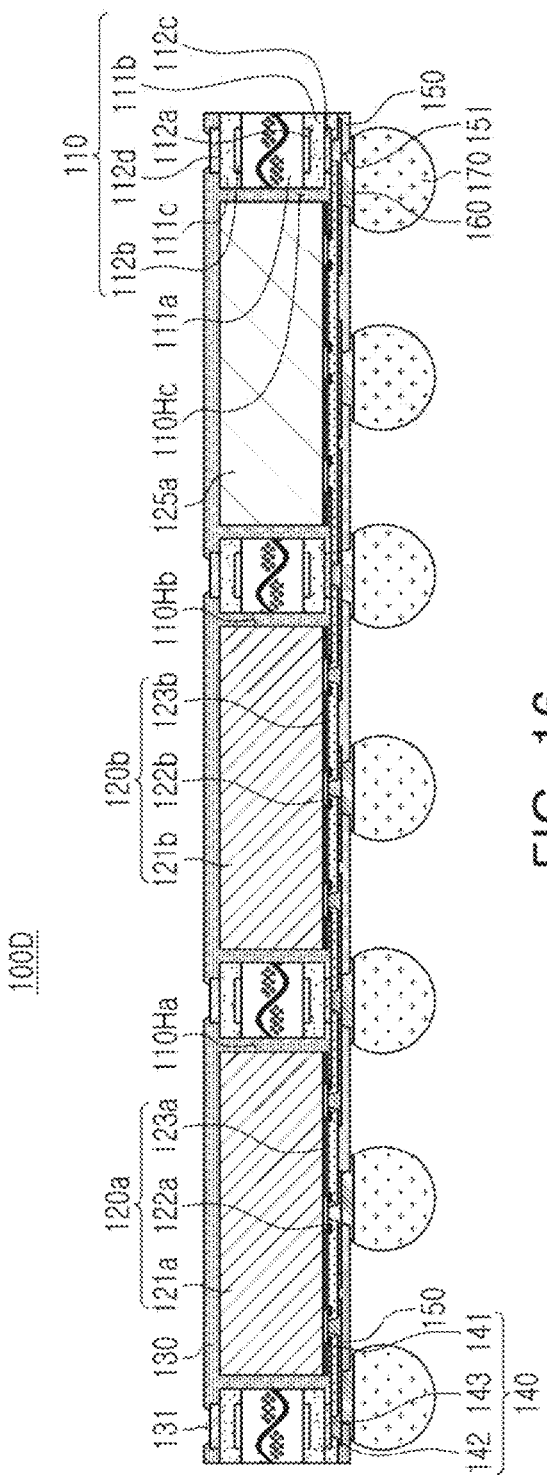
FIG. 16 is a schematic cross-sectional view illustrating another example of a fan-out semiconductor package.

FIG. 16 is a schematic cross-sectional view illustrating another example of a fan-out semiconductor package.

Referring to the drawing, in a fan-out semiconductor package 100D according to another exemplary embodiment in the present disclosure, a first connection member 110 may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to the connection pads 122. Since the first connection member 110 may include a larger number of redistribution layers 112a, 112b, 112c, and 112d, the second connection member 140 may be further simplified. Therefore, a decrease in yield depending on a defect occurring in a process of forming the second connection member 140 may be improved. Meanwhile, the first to fourth redistribution layers 112a, 112b, 112c, and 112d may be electrically connected to each other through first to third vias (not illustrated) penetrating through the first to third insulating layers 111a, 111b, and 111c.

The first insulating layer 111a may have a thickness greater than those of the second insulating layer 111b and the third insulating layer 111c. The first insulating layer 111a may basically be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first connection member 110 may be disposed on a level below a lower surface of the connection pad 122 of the semiconductor chip 120. In addition, a distance between a redistribution layer 142 of the second connection member 140 and the third redistribution layer 112c of the first connection member 110 may be smaller than that between the redistribution layer 142 of the second connection member 140 and the connection pads 122 of the semiconductor chip 120. The reason is that the third redistribution layer 112c may be disposed in a protruding form on the second insulating layer 111b, resulting in contacting the second connection member 140. The first redistribution layer 112a and the second redistribution layer 112b of the first connection member 110 may be disposed on a level between an active surface and an inactive surface of the semiconductor chip 120. The first connection member 110 may be formed at a thickness corresponding to that of the semiconductor chip 120. Therefore, the first and second redistribution layers 112a and 112b formed in the first connection member 110 may be disposed on a level between the active surface and the inactive surface of the semiconductor chip 120.

Thicknesses of the redistribution layers 112a, 112b, 112c, and 112d of the first connection member 110 may be greater than that of the redistribution layer 142 of the second connection member 140. Since the first connection member 110 may have a thickness equal to or greater than that of the semiconductor chip 120, the redistribution layers 112a, 112b, 112c, and 112d may also be formed to be relatively large. On the other hand, the redistribution layer 142 of the second connection member 140 may be formed to be relatively small, for thinness.

A thickness of the fourth redistribution layer 112d may be greater than that of the third redistribution layer 112c. In addition, a content of copper included in the fourth redistribution layer 112d may be greater than that of copper included in the third redistribution layer 112c. The first connection member 110 may be introduced, such that warpage of the fan-out semiconductor package 100D may be more effectively controlled together with the dummy chip 125a. Here, in a case in which the fourth redistribution layer 112d disposed at a relatively highest level is designed to be greater than the third redistribution layer 112c disposed at a relatively lowest level and have a copper portion larger than that of the third redistribution layer 112c, warpage at high temperature may be more effectively controlled.

Descriptions of configurations overlapping the previously described configuration will be omitted. Meanwhile, the description of the fan-out semiconductor package 100B described above may also be applied to the fan-out semiconductor package 100D.

FIG. 17 is a schematic cross-sectional view illustrating an example of a fan-out semiconductor package in which a dummy chip is not disposed.

FIG. 18 is a schematic plan view of the fan-out semiconductor package taken along line III-III' of FIG. 17.

Referring to the drawings, a fan-out semiconductor package in which a dummy chip is not disposed may include a first connection member 110' having first and second through-holes 110Ha' and 110Hb', first and second semiconductor chips 120a' and 120b' disposed, respectively, in the first and second through-holes 110Ha' and 110Hb' of the first connection member 110' and having active surfaces having connection pads disposed thereon and inactive surfaces disposed to oppose the active surfaces, an encapsulant 130' encapsulating at least portions of the first connection member 110' and the inactive surfaces of the first and second semiconductor chips 120a' and 120b', a second connection member 140' disposed on the first connection member 110' and the active surfaces of the first and second semiconductor chips 120a' and 120b', a passivation layer 150' disposed on the second connection member 140', an underbump metal layer 160' formed on openings 151' of the passivation layer 150', and connection terminals 170' disposed on the underbump metal layer 160'.

As described above, in the case in which the semiconductor chips 120a' and 120b' are disposed to be biased to one side of the fan-out semiconductor package, when heat is applied to the fan-out semiconductor package in a reflow process, local warpage of a region in which the semiconductor chips 120a' and 120b' are disposed and local warpage of a region in which the semiconductor chips 120a' and 120b' are not disposed may be different from each other. Therefore, it may be difficult to control overall warpage of the fan-out semiconductor package. That is, in a case in which local warpage is generated in the region in which the semiconductor chips 120a' and 120b' are disposed due to the semiconductor chips 120a' and 120b' disposed to be biased, local warpage may be generated in an opposite direction in the region in which the semiconductor chips 120a' and 120b' are not disposed. In this case, when warpage is improved in one direction, warpage in the other direction is deteriorated, such that it may be difficult to control the overall warpage of the fan-out semiconductor package.

FIGS. 19A and 19B are schematic views illustrating warpage in a case in which a dummy chip is not disposed.

FIGS. 20A and 20B are schematic views illustrating warpage in a case in which a dummy chip is disposed.

Figure 21:
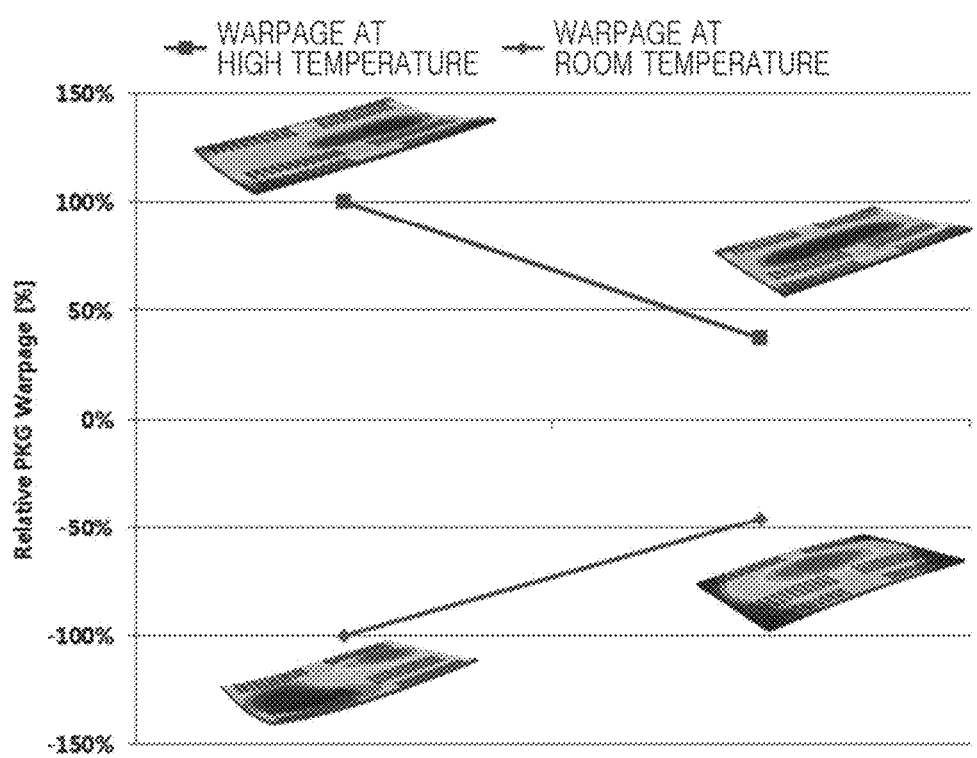
FIGS. 21 and 22 are schematic views illustrating a decrease in warpage through disposition of a dummy chip.
Figure 22:
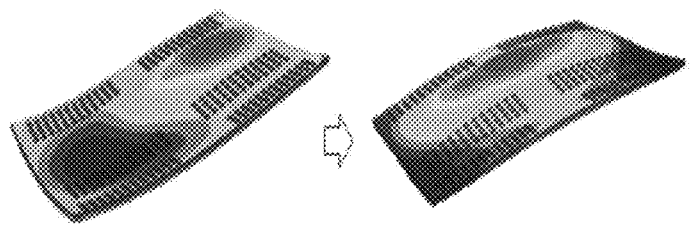

FIGS. 21 and 22 are schematic views illustrating a decrease in warpage through disposition of a dummy chip.

Referring to the drawings, it may be appreciated that in a case in which a dummy chip is not disposed, local warpage of a region in which a semiconductor chip is disposed and local warpage of a region which the semiconductor chip is not disposed are different from each other, and thus, overall warpage of a fan-out semiconductor package may be severely generated. On the other hand, it may be appreciated that in a case in which the dummy chip is disposed, even though the semiconductor chip is disposed to be biased to one side of the fan-out semiconductor package, local warpages generated in different directions in two regions may be offset against each other, and thus, overall warpage of the fan-out semiconductor package may be improved.

As set forth above, according to the exemplary embodiment in the present disclosure, a fan-out semiconductor package in which a warpage problem may be effectively solved may be provided.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first connection member is disposed on a level higher than a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first connection member having a through-hole;
a semiconductor chip disposed in the through-hole and having an active surface having connection pads disposed thereon and an inactive surface disposed to oppose the active surface;
a dummy chip disposed in the through-hole and spaced apart from the semiconductor chip;
a second connection member disposed on the first connection member, the dummy chip, and the active surface of the semiconductor chip; and
an encapsulant encapsulating at least portions of the first connection member, the dummy chip, and the inactive surface of the semiconductor chip,
wherein the first connection member and the second connection member include, respectively, redistribution layers electrically connected to the connection pads.

2. The fan-out semiconductor package of claim 1, wherein the dummy chip is electrically insulated from the semiconductor chip.

3. The fan-out semiconductor package of claim 1, wherein the dummy chip decreases a warpage generated through disposition of the semiconductor chip.

4. The fan-out semiconductor package of claim 1, wherein the first connection member includes a first redistribution layer exposed to a first surface thereof and contacting the second connection member, and a second redistribution layer exposed to a second surface thereof and contacting the encapsulant, and
the second redistribution layer has a thickness greater than that of the first redistribution layer.

5. The fan-out semiconductor package of claim 4, wherein a content of copper included in the second redistribution layer is greater than a content of copper included in the first redistribution layer.

6. The fan-out semiconductor package of claim 1, wherein the number of through-holes is plural, and
the semiconductor chip and the dummy chip are disposed, respectively, in the plurality of through-holes.

7. The fan-out semiconductor package of claim 1, wherein the number of through-holes is one, and
the semiconductor chip and the dummy chip are disposed together in the one through-hole.

8. The fan-out semiconductor package of claim 1, wherein the first connection member includes a first insulating layer, a first redistribution layer contacting the second connection member and embedded in the first insulating layer, and a second redistribution layer disposed on a second surface of the first insulating layer opposing a first surface of the first insulating layer in which the first redistribution layer is embedded, and
the first and second redistribution layers are electrically connected to the connection pads.

9. The fan-out semiconductor package of claim 8, wherein the first connection member further includes a second insulating layer disposed on the first insulating layer and covering the second redistribution layer and a third redistribution layer disposed on the second insulating layer, and
the third redistribution layer is electrically connected to the connection pads.

10. The fan-out semiconductor package of claim 8, wherein a distance between the redistribution layer of the second connection member and the first redistribution layer is greater than that between the redistribution layer of the second connection member and the connection pad.

11. The fan-out semiconductor package of claim 8, wherein the first redistribution layer has a thickness greater than that of the redistribution layer of the second connection member.

12. The fan-out semiconductor package of claim 8, wherein a lower surface of the first redistribution layer is disposed on a level higher than a lower surface of the connection pad.

13. The fan-out semiconductor package of claim 9, wherein the second redistribution layer is disposed on a level between the active surface and the inactive surface of the semiconductor chip.

14. The fan-out semiconductor package of claim 1, wherein the first connection member includes a first insulating layer, a first redistribution layer and a second redistribution layer disposed on both surfaces of the first insulating layer, respectively, a second insulating layer disposed on the first insulating layer and covering the first redistribution layer, and a third redistribution layer disposed on the second insulating layer, and the first to third redistribution layers are electrically connected to the connection pads.

15. The fan-out semiconductor package of claim 14, wherein the first connection member further includes a third insulating layer disposed on the first insulating layer and covering the second redistribution layer and a fourth redistribution layer disposed on the third insulating layer, and the fourth redistribution layer is electrically connected to the connection pads.

16. The fan-out semiconductor package of claim 14, wherein the first insulating layer has a thickness greater than that of the second insulating layer.

17. The fan-out semiconductor package of claim 14, wherein the third redistribution layer has a thickness greater than that of the redistribution layer of the second connection member.

18. The fan-out semiconductor package of claim 14, wherein the first redistribution layer is disposed on a level between the active surface and the inactive surface of the semiconductor chip.

19. The fan-out semiconductor package of claim 14, wherein a lower surface of the third redistribution layer is disposed on a level below a lower surface of the connection pad.

20. The fan-out semiconductor package of claim 1, wherein the dummy chip is disposed in a region of the fan-out semiconductor package in which the semiconductor chip is not disposed.

* * * * *